US008136071B2

(12) United States Patent
Solomon

(10) Patent No.: US 8,136,071 B2
(45) Date of Patent: *Mar. 13, 2012

(54) THREE DIMENSIONAL INTEGRATED CIRCUITS AND METHODS OF FABRICATION

(76) Inventor: Neal Solomon, Oakland, CA (US)

( * ) Notice: Subject to any disclaimer, the term of this patent is extended or adjusted under 35 U.S.C. 154(b) by 417 days.

This patent is subject to a terminal disclaimer.

(21) Appl. No.: 12/283,443

(22) Filed: Sep. 12, 2008

(65) Prior Publication Data
US 2009/0070727 A1  Mar. 12, 2009

Related U.S. Application Data

(60) Provisional application No. 60/993,638, filed on Sep. 12, 2007.

(51) Int. Cl.
*G06F 17/50* (2006.01)
*H03K 19/173* (2006.01)
*H03K 19/00* (2006.01)
*H01L 25/00* (2006.01)
*H01L 23/52* (2006.01)
*H01L 21/70* (2006.01)
*H01L 23/58* (2006.01)

(52) U.S. Cl. ........ 716/119; 716/126; 716/137; 716/138; 326/38; 326/41; 326/47; 326/101; 257/211; 257/499; 257/798

(58) Field of Classification Search .............. 716/9, 10, 716/13, 14; 326/38, 41, 47, 101; 257/211, 257/499, 798
See application file for complete search history.

(56) References Cited

U.S. PATENT DOCUMENTS

| 5,111,278 | A  | * | 5/1992  | Eichelberger | 257/698 |
| 5,426,072 | A  | * | 6/1995  | Finnila      | 438/107 |
| 5,657,537 | A  | * | 8/1997  | Saia et al.  | 29/830  |
| 5,915,167 | A  | * | 6/1999  | Leedy        | 438/108 |
| 6,501,111 | B1 | * | 12/2002 | Lowrey       | 257/295 |
| 6,717,222 | B2 | * | 4/2004  | Zhang        | 257/390 |
| 7,160,761 | B2 | * | 1/2007  | Cleeves et al. | 438/131 |
| 7,692,448 | B2 | * | 4/2010  | Solomon      | 326/38  |
| 7,772,880 | B2 | * | 8/2010  | Solomon      | 326/38  |
| 2009/0066365 | A1 | * | 3/2009 | Solomon      | 326/41  |
| 2009/0066366 | A1 | * | 3/2009 | Solomon      | 326/41  |
| 2009/0070721 | A1 | * | 3/2009 | Solomon      | 716/8   |
| 2009/0070728 | A1 | * | 3/2009 | Solomon      | 716/16  |

OTHER PUBLICATIONS

Cong et al., "Thermal-Aware Physical Design Flow for 3-D ICs", IEEE International VLSI Multilevel Interconnection Conference, Sep. 2006, pp. 73-80.*
Healy et al., "Multiobjective Microarchietectural Floorplanning for 2-D and 3-D ICs", IEEE Transaction on Computer-Aided Design of Integrated Circuits and Systems, vol. 26, No. 1, Jan. 2007, 38-52.*

* cited by examiner

*Primary Examiner* — Phallaka Kik

(57) ABSTRACT

The invention relates to multi-planar logic components in a three-dimensional (3D) integrated circuit (IC) apparatus configuration. A multi-planar integrated circuit connected by through silicon vias is configured to connect microprocessor, FPGA and memory components. The integrated circuit components may be on tiles of layers of the 3D IC.

20 Claims, 15 Drawing Sheets

THREE DIMENSIONAL INTEGRATED CIRCUITS AND METHODS OF FABRICATION

CROSS-REFERENCES TO RELATED APPLICATIONS

The present application claims the benefit of priority under U.S.C. §119 from U.S. Provisional Patent Application Ser. No. 60/993,638 filed on Sep. 12, 2007, the disclosure of which is hereby incorporated by reference in their entirety for all purposes.

FIELD OF INVENTION

The invention involves 3D system on chip (SoC) and network on chip (NoC) semiconductor technology. Components of the present invention involve micro-electro-mechanical systems (MEMS) and nano-electro-mechanical systems (NEMS). The invention also deals with fabrication methods of constructing 3D IC components.

BACKGROUND

The challenge of modern computing is to build economically efficient chips that incorporate more transistors to meet the goal of achieving Moore's law of doubling performance every two years. The limits of semiconductor technology are affecting this ability to grow in the next few years, as transistors become smaller and chips become bigger and hotter. The semiconductor industry has developed the system on a chip (SoC) as a way to continue high performance chip evolution.

So far, there have been four main ways to construct a high performance semiconductor. First, chips have multiple cores. Second, chips optimize software scheduling. Third, chips utilize efficient memory management. Fourth, chips employ polymorphic computing. To some degree, all of these models evolve from the Von Neumann computer architecture developed after WWII in which a microprocessor's logic component fetches instructions from memory.

The simplest model for increasing chip performance employs multiple processing cores. By multiplying the number of cores by eighty, Intel has created a prototype teraflop chip design. In essence, this architecture uses a parallel computing approach similar to supercomputing parallel computing models. Like some supercomputing applications, this approach is limited to optimizing arithmetic-intensive applications such as modeling.

The Tera-op, Reliable, Intelligently Adaptive Processing System (TRIPS), developed at the University of Texas with funding from DARPA, focuses on software scheduling optimization to produce high performance computing. This model's "push" system uses data availability to fetch instructions, thereby putting additional pressure on the compiler to organize the parallelism in the high speed operating system. There are three levels of concurrency in the TRIPS architecture, including instruction-level parallelism (ILP), thread-level parallelism (TLP) and data-level parallelism (DLP). The TRIPS processor will process numerous instructions simultaneously and map them onto a grid for execution in specific nodes. The grid of execution nodes is reconfigurable to optimize specific applications. Unlike the multi-core model, TRIPS is a uniprocessor model, yet it includes numerous components for parallelization.

The third model is represented by the Cell microprocessor architecture developed jointly by the Sony, Toshiba and IBM (STI) consortium. The Cell architecture uses a novel memory "coherence" architecture in which latency is overcome with a bandwidth priority and in which power usage is balanced with peak computational usage. This model integrates a microprocessor design with coprocessor elements; these eight elements are called "synergistic processor elements" (SPEs). The Cell uses an interconnection bus with four unidirectional data flow rings to connect each of four processors with their SPEs, thereby meeting a teraflop performance objective. Each SPE is capable of producing 32 GFLOPS of power in the 65 nm version, which was introduced in 2007.

The MOrphable Networked Micro-ARCHitecture (MONARCH) uses six reduced instruction set computing (RISC) microprocessors, twelve arithmetic clusters and thirty-one memory clusters to achieve a 64 GFLOPS performance with 60 gigabytes per second of memory. Designed by Raytheon and USC/ISI from DARPA funding, the MONARCH differs distinctly from other high performance SoCs in that it uses evolvable hardware (EHW) components such as field programmable compute array (FPCA) and smart memory architectures to produce an efficient polymorphic computing platform.

MONARCH combines key elements in the high performance processing system (HPPS) with Data Intensive Architecture (DIVA) Processor in Memory (PIM) technologies to create a unified, flexible, very large scale integrated (VLSI) system. The advantage of this model is that reprogrammability of hardware from one application-specific integrated circuit (ASIC) position to another produces faster response to uncertain changes in the environment. The chip is optimized to be flexible to changing conditions and to maximize power efficiency (3-6 GFLOPS per watt). Specific applications of MONARCH involve embedded computing, such as sensor networks.

These four main high performance SoC models have specific applications for which they are suited. For instance, the multi-core model is optimized for arithmetic applications, while MONARCH is optimized for sensor data analysis. However, all four also have limits.

The multi-core architecture has a problem of synchronization of the parallel micro-processors that conform to a single clocking model. This problem limits their responsiveness to specific types of applications, particularly those that require rapid environmental change. Further, the multi-core architecture requires "thread-aware" software to exploit its parallelism, which is cumbersome and produces quality of service (QoS) problems and inefficiencies.

By emphasizing its compiler, the TRIPS architecture has the problem of optimizing the coordination of scheduling. This bottleneck prevents peak performance over a prolonged period.

The Cell architecture requires constant optimization of its memory management system, which leads to QoS problems.

Finally, MONARCH depends on static intellectual property (IP) cores that are limited to combinations of specified pre-determined ASICs to program its evolvable hardware components. This restriction limits the extent of its flexibility, which was precisely its chief design advantage.

In addition to SoC models, there is a network on a chip (NoC) model, introduced by Arteris in 2007. Targeted to the communications industry, the 45 nm NoC is a form of SoC that uses IP cores in FPGAs for reprogrammable functions and that features low power consumption for embedded computing applications. The chip is optimized for on-chip communications processing. Though targeted at the communications industry, particularly wireless communications, the chip has limits of flexibility that it was designed to overcome, primarily in its deterministic IP core application software.

Various implementations of FPGAs represent reconfigurable computing. The most prominent examples are the Xilinx Virtex-II Pro and Virtex-4 devices that combine one or more microprocessor cores in an FPGA logic fabric. Similarly, the Atmel FPSLIC processor combines an AVR processor with programmable logic architecture. The Atmel microcontroller has the FPGA fabric on the same die to produce a fine-grained reconfigurable device. These hybrid FPGAs and embedded microprocessors represent a generation of system on a programmable chip (SOPC). While these hybrids are architecturally interesting, they possess the limits of each type of design paradigm, with restricted microprocessor performance and restricted deterministic TP core application software. Though they have higher performance than a typical single core microprocessor, they are less flexible than a pure FPGA model.

All of these chip types are two dimensional planar micro system devices. A new generation of three dimensional integrated circuits and components is emerging that is noteworthy as well. The idea to stack two dimensional chips by sandwiching two or more ICs using a fabrication process required a solution to the problem of creating vertical connections between the layers. IBM solved this problem by developing "through silicon vias" (TSVs) which are vertical connections "etched through the silicon wafer and filled with metal." This approach of using TSVs to create 3D connections allows the addition of many more pathways between 2D layers. However, this 3D chip approach of stacking existing 2D planar IC layers is generally limited to three or four layers. While TSVs substantially limit the distance that information traverses, this stacking approach merely evolves the 2D approach to create a static 3D model.

DESCRIPTION OF THE RELATED ART

In U.S. Pat. No. 5,111,278, Echelberger describes a 3D multi-chip module system in which layers in an integrated circuit are stacked by using aligned TSVs. This early 3D circuit model represents a simple stacking approach. U.S. Pat. No. 5,426,072 provides a method to manufacture a 3D IC from stacked silicon on insulation (SOI) wafers. U.S. Pat. No. 5,657,537 presents a method of stacking two dimensional circuit modules and U.S. Pat. No. 6,355,501 describes a 3D IC stacking assembly technique.

Recently, 3D stacking models have been developed on chip in which several layers are constructed on a single complementary metal oxide semiconductor (CMOS) die. Some models have combined eight or nine contiguous layers in a single CMOS chip, though this model lacks integrated vertical planes. MIT's microsystems group has created 3D ICs that contain multiple layers and TSVs on a single chip.

3D FPGAs have been created at the University of Minnesota by stacking layers of single planar FPGAs. However, these chips have only adjacent layer connectivity.

3D memory has been developed by Samsung and by BeSang. The Samsung approach stacks eight 2-Gb wafer level processed stack packages (WSPs) using TSVs in order to minimize interconnects between layers and increase information access efficiency. The Samsung TSV method uses tiny lasers to create etching that is later filled in with copper. BeSang combines 3D package level stacking of memory with a logic layer of a chip device using metal bonding.

See also U.S. Pat. No. 5,915,167 for a description of a 3D DRAM stacking technique, U.S. Pat. No. 6,717,222 for a description of a 3D memory IC, U.S. Pat. No. 7,160,761 for a description of a vertically stacked field programmable nonvolatile memory and U.S. Pat. No. 6,501,111 for a description of a 3D programmable memory device.

Finally, in the supercomputing sphere, the Cray T3D developed a three dimensional supercomputer consisting of 2048 DEC Alpha chips in a torus networking configuration.

In general, all of the 3D chip models merely combine two or more 2D layers. They all represent a simple bonding of current technologies. While planar design chips are easier to make, they are not generally high performance.

Prior systems demonstrate performance limits, programmability limits, multi-functionality limits and logic and memory bottlenecks. There are typically trade-offs of performance and power.

SUMMARY

The main idea behind three dimensional integrated circuits is the ability to combine layers of ICs into a single functional entity. The construction of 3D ICs resembles a skyscraper compared to one-story planar IC structures. The stacking of functional layers of ICs is revolutionary because it allows increased efficiency and enhanced performance objectives. Solving the problems of three dimensional ICs with multi-layer vias moves the semiconductor industry forward by a generation. The 3D IC elements described in the invention are the building blocks of next generation 3D SoCs.

3D ICs are constructed by integrating layers with through silicon vias (TSVs). There are three types of TSVs: (a) through wafer via, (b) connected-to-top via and (c) connected-to-bottom via. Vias attach to interconnect trees in multiple wafers. TSVs are created using different methods. These methods include deposition of via insulation barrier, wafer thinning, electroplating and laser cutting. Once a tiny hole is created, copper is typically used to fill the hole to create a 3D interconnect for integrating multiple circuit layers. TSV holes are also filled with conducting metals of gold, silver or platinum. 3D trees are created by connecting the top of one layer to the bottom of another layer with a TSV.

The TSVs are applied to construct 3D microprocessors, 3D application specific integrated circuits (ASICs), 3D complex programmable logic devices (CPLDs), 3D field programmable gate arrays (FPGAs) and 3D memory devices as well as hybrids of these devices.

While previous TSVs have connected only two adjacent layers, which are limiting, multi-layer TSVs in the present invention, allow the interoperation of several integrated layers, thereby enabling greater operational functionality. The TSVs are applied to mixed function multi-planar 3D ICs, to 3D ASICs, to 3D microprocessors and to 3D routers.

Moore's law specifies that chip performance doubles every two years. This quest for increased performance requires more transistors to be used in circuits. In order to accomplish this technology goal, chip fabrication processes have been developed to make smaller transistors. While recent chip fabrication techniques have generated 65 nm transistor dimensions and 45 nm techniques are now being implemented, the next generations of fabrication techniques are in scales of 32 nm, 22 nm and 16 nm. After 16 nm, the physical properties of electrons make transistor construction less efficient. However, the smaller the fabrication technique, and the larger the wafer, the more chips can be placed on a wafer, and the cheaper the process per chip becomes. Therefore, smaller-scale chip production processes produce the opportunity for high performance cost effective chips.

The 3D SoC is organized to be constructed at 45 nm, 32 nm, 22 nm, 16 nm and 10 nm scales across five generations. At 45 nm, deep submicron lithographic techniques are required, including immersion lithography and ultra-low-k interconnect dielectrics. At 32 nm, immersion lithography is used with double patterning. Alternatively, extreme UV lithography is used at 32 nm. At 22 nm, expected in 2011, hyper numerical aperture immersion lithography will be employed. At 16 nm, expected in 2014, high index immersion lithography with double patterning will be used. New techniques will be needed to create 10 nm chips, including electron beam lithography, expected in 2017. An alternative to lithography at the deep submicron scale, that is, below 22 nm, includes a technique to use self-assembled polymers poured into a silicon wafer with a nano-scale wired circuit pattern; the assembly is then baked, and carbon silicate glass is removed to create a vacuum between the wires.

Different materials are used in 3D IC components, particularly silicon, gallium arsenide, germanium, silicon germanium and hafnium.

While in a main embodiment the 3D IC manifests in a cubic configuration, in other embodiments, the chips are configured in oblong shapes. Rectangular structures of chips are useful in mobile embedded applications.

The present invention views the system on a chip as an ecosystem consisting of significant intelligent components. The prior art for intelligence in computing consists of two main paradigms. On the one hand, the view of evolvable hardware (EHW) uses FPGAs as examples. On the other hand, software elements consist of intelligent software agents that exhibit collective behaviors. Both of these hardware and software aspects take inspiration from biological domains.

First, the intelligent SoC borrows from biological concepts of post-initialized reprogrammability that resembles a protein network that responds to its changing environmental conditions. The interoperation of protein networks in cells is a key behavioral paradigm for the iSoC. The slowly evolving DNA root structure produces the protein network elements, yet the dynamics of the protein network are interactive with both itself and its environment.

Second, the elements of the iSoC resemble the subsystems of a human body. The circulatory system represents the routers, the endocrine system is the memory, the skeletal system is comparable to the interconnects, the nervous system is the autonomic process, the immune system provides defense and security as it does in a body, the eyes and ears are the sensor network and the muscular system is the bandwidth. In this analogy, the brain is the central controller.

For the most part, SoCs require three dimensionality in order to achieve high performance objectives. In addition, SoCs require multiple cores that are reprogrammable so as to maintain flexibility for multiple applications. Such reprogrammability allows the chip to be implemented cost effectively. Reprogrammability, moreover, allows the chip to be updatable and future proof. In some versions, SoCs need to be power efficient for use in embedded mobile devices. Because they will be prominent in embedded devices, they also need to be fault tolerant. By combining the best aspects of deterministic microprocessor elements with indeterministic EHW elements, an intelligent SoC efficiently delivers superior performance.

While the design criteria are necessary, economic efficiency is also required. Computational economics reveals a comparative cost analysis that includes efficiency maximization of (a) power, (b) interconnect metrics, (c) transistor per memory metrics and (d) transistor per logic metrics.

Optimization problems that the system solves can be divided into two classes: bi-objective optimization problems (BOOPs) and multi-objective optimization problems (MOOPs).

BOOPs consist of trade-offs in semiconductor factors such as (a) energy consumption versus performance, (b) number of transistors versus heat dissipation, (c) interconnect area versus performance and (d) high performance versus low cost.

Regarding MOOPs, the multiple factors include: (a) thermal performance (energy/heat dissipation), (b) energy optimization (low power use), (c) timing performance (various metrics), (d) reconfiguration time (for FPGAs and CPLDs), (e) interconnect length optimization (for energy delay), (f) use of space, (g) bandwidth optimization and (h) cost (manufacture and usability) efficiency. The combination of solutions to trade-offs of multiple problems determines the design of specific semiconductors. The present system presents a set of solutions to these complex optimization problems.

One of the chief problems is to identify ways to limit latency. Latency represents a bottleneck in an integrated circuit when the wait to complete a task slows down the efficiency of the system. Examples of causes of latency include interconnect routing architectures, memory configuration and interface design. Limiting latency problems requires the development of methods for scheduling, anticipation, parallelization, pipeline efficiency and locality-priority processing.

The present description of 3D IC apparatuses elucidates the construction of MPs, ASICs and an integrated multilayer hybrid circuit that consists of memory, multiprocessor and CPLD logic components on different layers. The use of TSVs across multiple layers in a 3D IC substantially increases semiconductor efficiency and functionality.

Multilayer semiconductors have advantages over planar architectures. 3D ICs require less interconnect area per transistor, which increases performance while also reducing energy consumption. Multifunctional 3D chips allow flexibility for multiple application domains.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.) the terms (including a reference to a "means") used to describe such elements are intended to correspond, unless otherwise indicated, to any element that performs the specified function of the described element (i.e., that is functionally equivalent), even though not structurally equivalent to the disclosed structure that performs the function in the herein illustrated exemplary embodiment or embodiments of the invention. Tn addition, while a particular feature of the invention may have been described above with respect to only one or more of several illustrated embodiments, such feature may be combined with one or more other features of the other embodiments, as may be desired and advantageous for any given or particular application.

Acronyms
3D, three dimensional
ASIC, application specific integrated circuit
BOOP, bi-objective optimization problem
CMOS, complementary metal oxide semiconductor
CPLD, complex programmable logic device
D-EDA, dynamic electronic design automation
DTVA, data intensive architecture
DLP, data level parallelism
DRAM, Dynamic random access memory
DSP, Digital signal processor
EDA, electronic design automation
EHW, evolvable hardware eMOOP, evolvable multi-objective optimization problem
FLOP, floating operations per second
FPCA, field programmable compute array
FPGA, field programmable gate array
HPPS, high performance processing system
ILP, instruction level parallelism
IMLHC, Integrated multi-layer hybrid circuit
IP, intellectual property
iSoC, intelligent system on a chip
MAC, Multiply Accumulate Converter
MEMS, micro electro mechanical system
MONARCH, morphable networked micro-architecture
MOOP, multi-objective optimization problem
MPSOC, multi-processor system on a chip
NEMS, nano electro mechanical system
NoC, network on a chip
PCA, polymorphous computing architecture
PIM, processor in memory
RF, radio frequency
RISC, reduced instruction set computing
SCOC, supercomputer on a chip
SoC, system on a chip
SOI, silicon on insulation
SOPC, system on a programmable chip
SPE, synergistic processor element
TLP, thread level parallelism
TRIPS, Tera-op reliable intelligently adaptive processing system
TSV, through silicon via
VLSI, very large scale integration
WSPS, wafer level processed stack packages

DETAILED DESCRIPTION OF THE DRAWINGS

Figure 1:
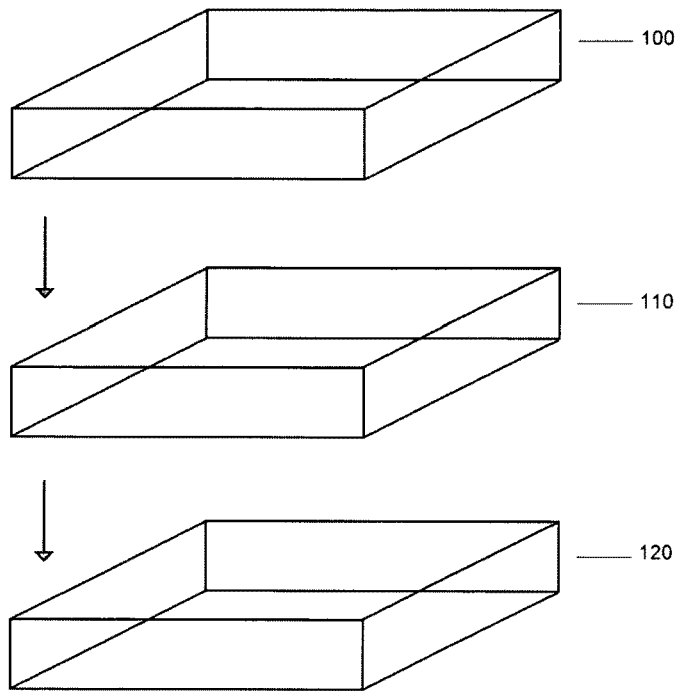
FIG. 1 is a schematic drawing of three layers of an integrated circuit.

The disclosure describes solutions for problems involving how to structure vias in 3D circuits and how to build and organize layers in integrated circuits.

(1) Inter-Layer Through Silicon Vias (TSVs) in 3D IC

Though TSVs are like worm hole etchings that connect two layers in a multi-layer IC, the present system introduces the concept of interlayer TSVs which appear at multiple points between the layers in a stack of IC layers. This approach is useful for connecting parts of each layer to parts of other layers. In the case of dividing an IC layer into separate tiles, each tile is connected to other tiles above and below in multiple layers.

An example of this model is the way in which logic circuitry is situated on one tile of one layer and memory circuitry on another tile of an adjacent layer of a 3D IC. The interlayer TSVs connect these components at different locations even though they appear at different spatial coordinates on the two layers.

(2) Multi-Layer Through Silicon Vias (TSVs) in 3D IC

Most TSVs appear as adjoining connected floors of a building; they connect only adjacent layers in one position. The present system connects multiple layers to each other by using TSVs that connect layers that are not only adjacent. For example, on an eight layer stack, layer two is connected not only to layers one and three but also to layers four, five, six, seven and eight. All layers are interconnected with a multi-layer fabric woven beyond the nearest neighbor. These multi-layer TSVs create connections between layers at multiple points rather than merely a single spot that could represent a bottleneck. This model dramatically improves functional performance in part because of the increased connectedness between layers, but also because of the increased connectedness between parts of layers.

In another embodiment of the present system TSVs are created on the outside edge of layers. This model resembles elevator shafts on the outside edge of a building. Using multiple outside elevator shaft type TSVs allows high bandwidth to provide simultaneous contact between all layers.

(3) Mixed Function Multi-Planar IC

While other 3D ICs are homogenous, where, for instance, 3D memory is simply stacked planar memory modules, the present system introduces the notion of a 3D circuit with multiple functions on different layers. In one embodiment, stacks of layers contain opto-electronic, digital logic (DSP or MAC), analog (RF), memory and sensor components. By using multiple functional layers, the present system implements cross-functional integration across the 3D fabric.

There is a distinctive advantage of separating the layers by functionality. In a mixed signal 3D IC, it is advantageous to isolate the analog signals on a separate layer with shielding from digital layers so as to suppress noise crossover.

In an additional embodiment of mixed functionality in a multi-planar IC, a hybrid 3D integrated circuit contains tiles on each layer, with each tile possessing a separate function. For example, a single layer has memory, logic, analog, optical-electronic and sensor components in a microprocessor configuration using Von Neumann architecture, while other layers are similar. However, with TSVs, the sections of each layer are connected to other layers. In this model, the memory from one layer may be shared by the logic from another so as to optimize operational efficiency.

(4) Multi-Layer 3D Cubic ASIC

The system describes a model for a multi-layer ASIC. In this model, different layers have different functions. While the number of layers in the integrated circuit vary contingent on the thickness of the layers, in the present model the chip is configured as a cube. The width of the plane of each layer is calibrated with the distance between layers in the stacking process, depending on each application. The number of layers to be used is relative to the base layer surface area. In general, there are from 6 layers to 108 layers. In the former case, the layers are relatively thicker and the layer surface area is smaller. In the latter case, preformed extremely thin layers in wafers of CMOS fabrication composed of 9 layers are each stacked in a group of twelve wafers to construct a cubic IC.

The distance between each layer is modulated depending on the functional utility of each layer. For some analog applications, it is advantageous to separate the analog layers from the digital layers with more distance or a strong partition.

The relative positioning of the layers is structured with memory layers in the center so as to allow the logic layers on top and bottom to share memory functionality to increase operational performance.

As the lithographic techniques used in semiconductor fabrication move from 45 nm to 32 nm and from 32 nm to 22 nm and 16 nm, the size of the transistors and the wafers drop proportionately. In this evolutionary scenario, the size of the 3D ICs decline even as the performance increases. 3D architectures further improve performance.

(5) Multi-Layer 3D Cubic Microprocessor Architecture

A typical planar microprocessor uses a design to fetch instructions from memory with each clock cycle in order to perform a logical or arithmetic process. In a 3D microprocessor, the main logic, arithmetic and memory components are on different layers. A memory layer will be shared by, and sandwiched between, logic layers for increased efficiency because the access to the memory has minimal interconnection and maximum bandwidth.

In another embodiment, the multi-layer 3D microprocessor has tiles on each layer that includes all major components. In this complex model, multiple microprocessors on different layers interact with other microprocessors on other layers to share functions so as to optimize operation. This model works like a multi-core microprocessor but in a hyper-efficient 3D package.

(6) Integrated Multi-Layer Hybrid Circuit (IMLHC)

A standard microprocessor fetches code for two or more software programs and oscillates the programs' operations; while this offers application flexibility, it substantially retards computational performance and efficiency. A complex programmable logic device (CPLD) periodically restructures its architecture to different ASIC positions in order to repeatedly perform a specific task. Both logic circuit models have advantages of flexibility (MP) or performance (FPGA).

In the present invention, on the other hand, an integrated multi-layer hybrid circuit (TMLHC) is constructed of an MP (RTSC processor) on one layer and a CPLD on another layer in a 3D hybrid circuit. This model uses the Harvard architecture of accessing multiple memory sources in different data and instruction pipelines rather than the von Neumann model that is prominent in most microprocessors. By accessing multiple memory sources, the IMLHC uses memory layers sandwiched between MP and CPLD layers for optimum memory access. Additionally, memory is shared from embedded DRAM on board the MP layer(s) and CPLD layers(s) as well as on separate memory layers between the device's layers.

In a preferred embodiment, a single MP layer complements multiple FPGA layers. The MP layer is either in the center of the 3D IC in order to provide maximum access or in the top or bottom layer. This configuration promotes maximum flexibility and performance.

The advantage of the IMLHC is its ability to benefit from the best of both main architectures to adapt to specific applications while also performing a range of tasks. The IMLHC is optimized in the 3D configuration because of the efficiency maximization of sharing resources.

The combination of multiple heterogeneous layers into an IMLHC represents a polylithic integration into a complex VLSI architecture.

(7) Multi-Way 3D Router in 3D SoC

One of the challenges of operating in a 3D environment is the need to manage flow control. Operating the routing and switching within a network fabric of a SoC is critical to optimizing the functional advantages of 3D architecture. Unlike a planar two way router in most 2D integrated circuitry, the present system constructs a 3D router that sorts flow control functions by priority of destination.

The 3D multi-way router works somewhat like a stop light. Data objects enter from different directions and are sorted according to priority. However, unlike the typical stop light, the 3D router has six inputs corresponding to the sides of a box. The 3D router operates like a variable 6-way switch.

The 3D router has circuitry to identify incoming data packets and to route them to destinations. In heavy load situations, the router employs a cache to queue the entering data packets. The router uses a queuing algorithm that reprioritizes the destination of the data packets based on a resorting of the priorities. As the system criteria change, the router changes its routing pathways so as to optimize efficiency.

(8) Intermediate Layer in Multilayer 3D IC to Connect Functional Stacks CMOS fabrication techniques are used to build multilayer ICs up to nine layers on a single die. The present system stacks these multilayer ICs to create 3D SoCs. An intermediate layer is added between the stacks of CMOS multilayer ICs in order to provide various functions, from routing to supplemental memory to diminishment of analog circuitry interference. This intermediate layer, in another embodiment, is not functional but merely connects stacks of layers.

(9) Spherical Elements in 3D IC

While the cubic configuration is prominent in SoC IC elements, a spherical configuration is described as well. In some cases, such as shared memory modules or routers, a spherical geodesic module design is optimal.

In the spherical architecture, the center layer protrudes at the geodesic circumference while the layers at the top and bottom are smaller. The center layer has increased functional utility because it has more surface area. There are conditions in which the spherical model is increasingly efficient, particularly as it links to other modules at its outside circumference.

3D IC Fabrication Process (1) Combining Layers in 3D IC Package with Crossbars

Since the elemental IC nodes of 3D SoCs are themselves 3D, specific techniques are used to fabricate the chips. CMOS techniques are typically used to fabricate multi-layer ICs to construct a 3D chip. For example, in multi-layer IC construction using CMOS, up to 8 or 9 layers are combined on a single mask. The fabrication die is organized with multiple ultra-thin layers of transistors in logic and memory configurations.

Through silicon vias (TSVs) are integrated into the aggregate assembly during the fabrication process by installing holes at key junctures of tiles in the layers. Vias may be etched during fabrication or after fabrication. When done after mounting the layers, foundries etch vias once the attachment of the second die is made.

These multi-layer CMOS assemblies are stacked together, much as floors of a skyscraper are combined. Layers in 3D ICs are integrated with wafer bonding and low-temperature silicon epitaxy processes. The three most common ways of bonding between 3D chip layers are (a) oxide to oxide fusion, (b) copper tin eutectic bonding and (c) polymer bonding. The layers are precisely aligned by using alignment pins at different points on the planes.

Crossbars are used in the overall package to support the chip structure. The crossbars act as scaffolding so as to gain access to individual layers on the edges. The crossbars are used to house memory components and interconnects as well.

(2) Combining Multiple Inverted Pyramid Vias in 3D IC

One way to integrate TSVs into 3D ICs is to construct asymmetric layers that are built as broad pyramids with TSVs on the edges. The pyramid layers are combined by inverting alternating layers to create internal patterns of vias that connect specific tiles on specific layers. Changing the width of the pyramid layers changes the structural range of the via layout.

Combining interlocking inverted pyramid structures in a multi-layer 3D IC solves a range of problems in the fabrication of TSVs in the internal positions of multilayer chips. This method is particularly useful in fabricating TSVs in numerous positions on different parts of the different layers. For example, this method is useful in connecting the tiles of different layers.

The inverted pyramid via model is useful not only to connect TSVs between adjacent layers, but also to connect parts of multiple layers that are not adjacent. By allowing access of different layers in a 3D IC, the present system appreciably increases the efficiency and functional utility of the chip.

(3) Thermal Vias, Tiles and Layers in 3D IC for Heat Sinks

In order to keep up with Moore's law, chip makers need to increase the number and density of transistors over time as they also need to shrink production processes to make chips more efficient. The biggest problem with this evolutionary pathway is that transistors experience electron leakage, manifest in hotter chips, so efficiency and performance are compromised.

In order to combat the problem of excessive heat generation, a number of solutions have been provided, from low power modulation to slower chip clocking so as to reduce aggregate electronic output of integrated devices.

In the 3D IC nodes of a 3D SoC, empty TSV cavities are used as heat vents. While the TSV spaces are created using traditional methods, the spaces are not filled with copper. In this way, the empty TSVs provide critical venting for adjacent circuitry.

In addition to the use of empty TSVs, some of the tiles on specific layers contain empty chambers for heat dissipation. This is particularly useful in locations next to logic circuits that tend to generate heat. The location of the empty tiles between layers provides a major tunnel in the 3D IC to promote heat dissipation.

In addition to the use of empty TSVs and empty tile chambers on specific layers, 3D ICs have empty layers between stacks of circuits that also provide venting for heat dissipation.

(4) 3D Transistor in 3D CMOS IC

Though the invention of the transistor by Shockley specified a tubular configuration of elements, the vast majority of transistors in present day integrated circuits use a planar design. There are, however, problems with planar transistors at sub-35 nm scales, which is the design specification of next-generation SoCs and 3D ICs. At this deep submicron level, transistors experience leakage which leads to less performance and more heat. If Moore's law is to be maintained, the planar transistor's days are numbered.

Developed by Intel, tri-gate transistors (TGTs) are fabricated using CMOS techniques with on Silicon on Insulator (SOT) materials. The TGTs are 3D transistors that wrap around the gate. Their unique configuration limits electron drain in order to save power by using high-k metal gate materials. Specifically, a gate is mounted over two vertical gates in the TGT configuration. This 3D transistor model is particularly useful for specific types of SRAM cell configurations.

In another 3D transistor approach, developed at the University of California, Berkeley, the field effect transistor (FET) is modified at the deep submicron scale with "fins" to create a FinFET. In this configuration, the fins allow a dissipation of heat at the local transistor level. The FinFET architecture has a gate stacked on top of two vertical gates, thereby creating the 3D configuration. Specifically, a "conducting channel is wrapped around a thin silicon 'fin'" to create the FinFET. This approach is a derivative of a double gate FET.

In the case of both the TGTs and the FinFETs, the model for designing transistors for deep submicron scale fabrication is applicable to 3D IC fabrication. The 3D transistors are applied to layers of a multilayer IC. In the design specifications of 3D MPs, 3D FPGAs or 3D IC hybrids, several million transistors are configured to various logic and memory arrangements on each layer of the chips.

A new generation of trigate transistors that consist of two vertical gates and one horizontal gate, resembling a box, provides the opportunity to move from the 45 nm circuitry level to the 16 nm circuitry level. Trigate transistors allow production of far smaller circuits. 3D transistors provide multi-dimensional conductivity by using a layer of metal (not silicon) and are generally produced on insulator material.

Arrays of trigate transistors are arranged symmetrically within tiles on planar ICs. The layers of 2D planes are then stacked in 3D configurations. As an example, the apparatus configuration is arranged on 2D planes consisting of 8 tiles by 8 tiles. Each tile has a specific functionality, such as a part of a logic IC (DSP or MAC), a memory IC or an analog IC. While interconnects determine the efficiency of the layout on the individual plane, TSVs determine the efficiency of the 3D structure. With multiple TSVs, each tile is connected to tiles on other layers, thereby dramatically increasing connectedness of the parts of the layers into a fully functional integrated multilayer hybrid circuit.

The use of 3D transistors is key to meeting the high performance goals of the 3D SoC. With several million transistors per layer, up to 108 layers (12×9) per node, and 35 nodes, the 3D SoC may have as many as ten billion transistors. The use of 3D transistors in SoCs enables engineers to get closer to the goal of meeting Moore's law for another generation.

(5) Self-Assembling Lattice Grids of Nano-Wires in 3D Crossbar Latch in 3D IC

In addition to traditional lithographic approaches to IC fabrication, a new generation of chip construction techniques involves self-assembly of chemical processes using molecular forces. In one embodiment of the present invention, specific layers of the 3D IC's use lattice grids of intersecting nano-wires and apply voltage impulses at a junction for activation. Developed by HP labs, the "crossbar latch" uses voltage impulse sequences to control the nano-lattice grid behavior. This circuit configuration is an alternative to transistors.

Arrays of crossbar latches are integrated into specific layers of 3D ICs. The crossbar latches are used in specific tiles of specific layers in order to maintain operational efficiencies. The use of crossbar latches eliminates some problems associated with transistor heat but requires electrical device generation and modulation devices, which are provided on-chip at the periphery of specific layers.

Generations of the 3D iSoC Family

|  | Economy | Standard | High Performance |
|---|---|---|---|
| Gen 1: 2009 (32 nm) | 1.2 TFlop/s | | |
| Gen 2: 2011 (22 nm) | | 2.4 TFlop/s | |
| Gen 3: 2014 (16 nm) | | | 4 TFlop/s |
| Gen 4: 2017 (10 nm) | | | 10 TFlop/s |

Figure 2:
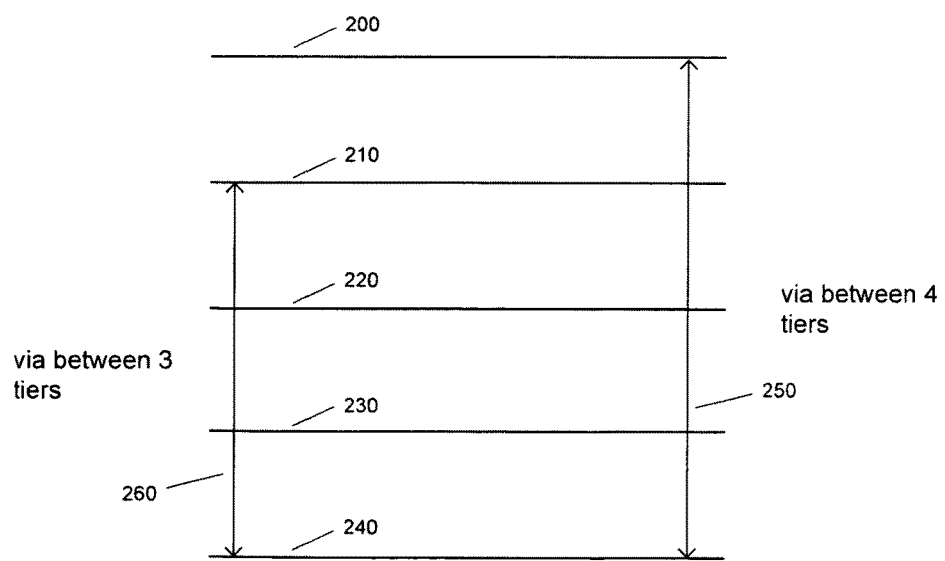
FIG. 2 is a schematic drawing of through silicon vias between several tiers of an integrated circuit.
Figure 3:
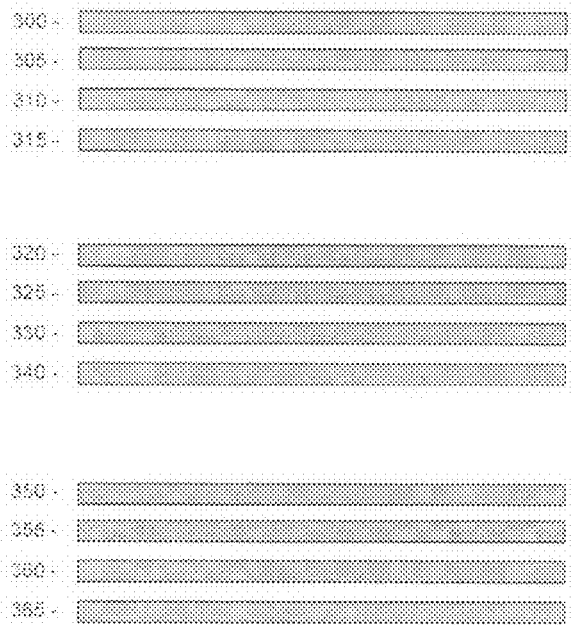
FIG. 3 is a schematic drawing of a set of layers of integrated circuits organized in three clusters in an integrated circuit node.

Three dimensional integrated circuits (3D ICs) are constructed by integrating layers of ICs in a fabrication process that incorporates through silicon vias (TSVs). FIG. 1 shows the stacking of three layers (100, 110 and 120) in a multilayer IC. FIG. 2 shows the use of a TSV (260) that connects three tiers (210, 220, 230 and 240) on the left side and a TSV (250) that connects four tiers (200, 210, 220, 230 and 240) on the right side. FIG. 3 shows three clusters of four IC layers each.

Figure 4:
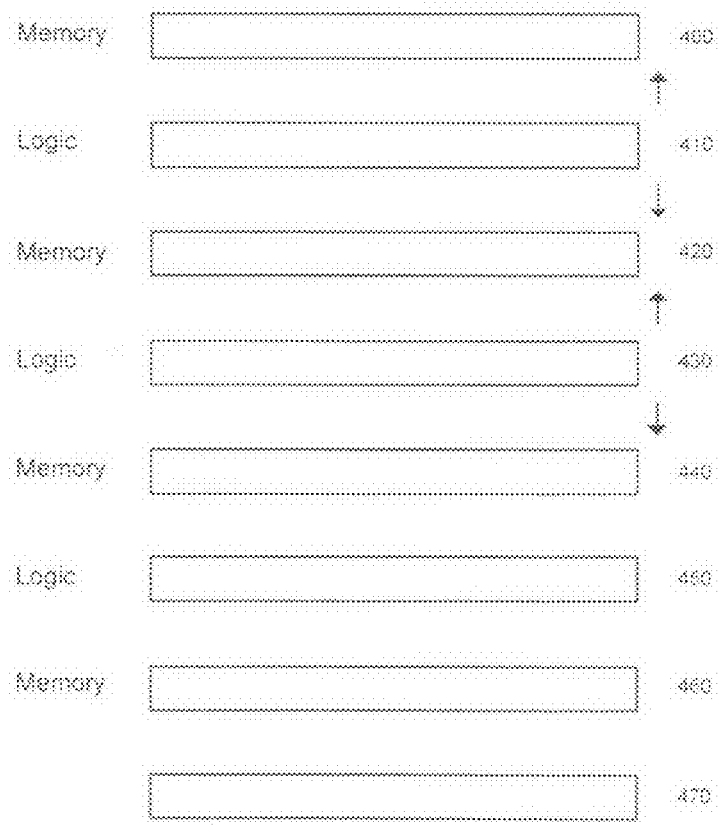
FIG. 4 is a schematic diagram of a multi-layer integrated circuit with different types of components.

FIG. 4 shows the alternating positions of logic and memory layers in a multilayer IC. Memory layers (400, 420, 440 and 460) alternate with logic layers (410, 430 and 450). This configuration has the advantage that a logic layer is able to store and access data and instructions in an adjacent memory layer.

Figure 5:
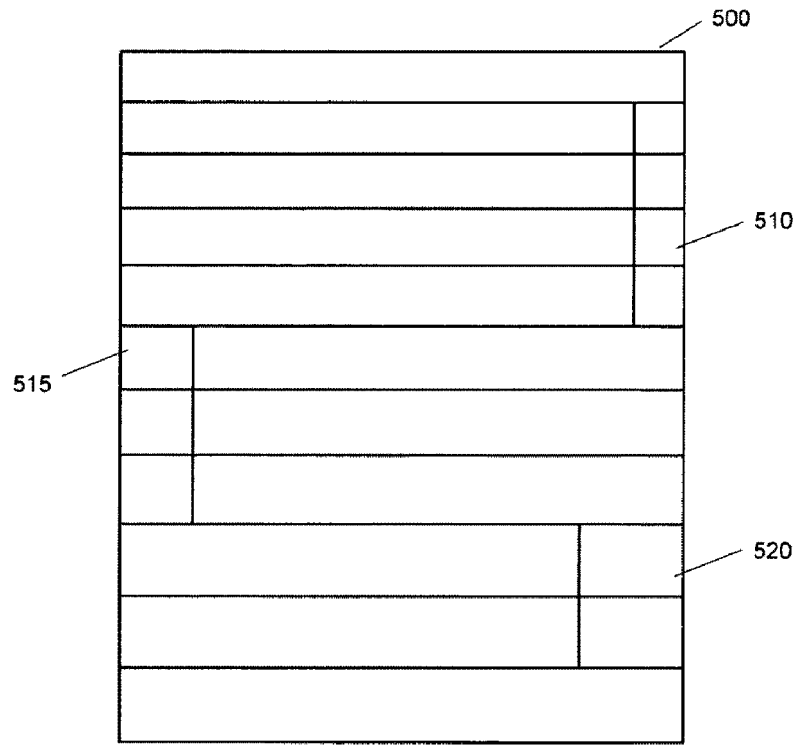
FIG. 5 is a schematic diagram showing the TSVs connecting several logic and memory layers in a multilayer IC.
Figure 6:
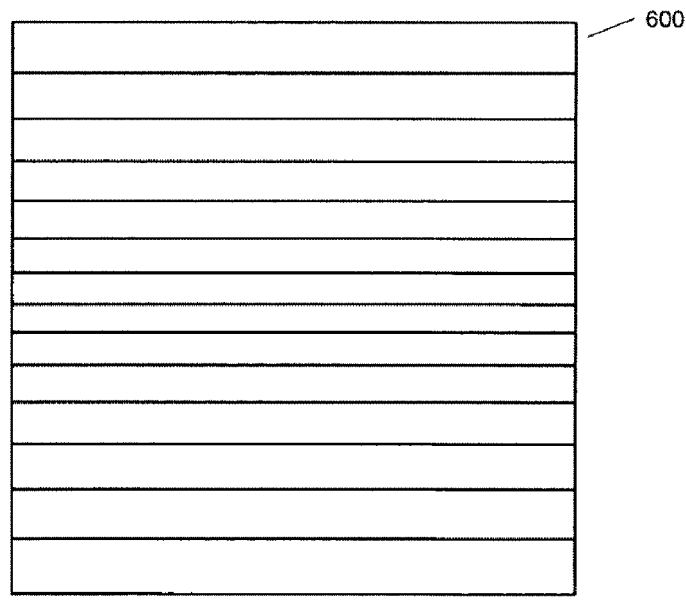
FIG. 6 is a schematic diagram showing a stack of layers of ICs in a multilayer 3D IC node.

FIG. 5 shows the use of TSVs (510, 515 and 520) between different layers of a multilayer IC. FIG. 6 shows a side view of a multilayer IC with 15 layers.

Figure 7:
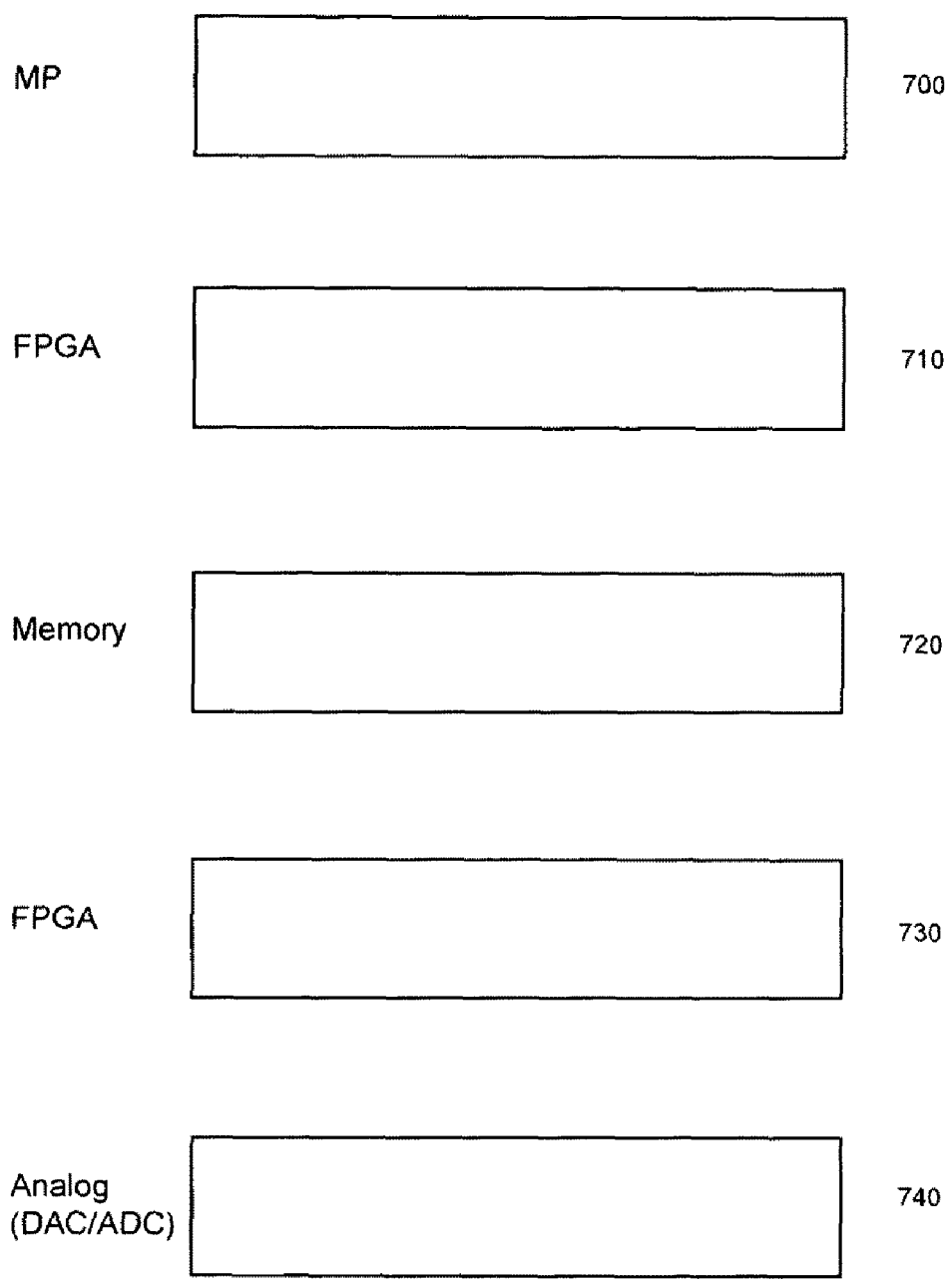
FIG. 7 is a schematic diagram showing the integration of several layers of logic and memory components in a multi-layer hybrid IC.

FIG. 7 shows the stacking of multiple logic and memory device types in a single 3D IC. At the top layer is a microprocessor (700), with an FPGA layer (710) at layer two, a memory layer (720) at layer three, an FPGA layer (730) at layer four and an analog layer (740) at layer five.

Figure 8:
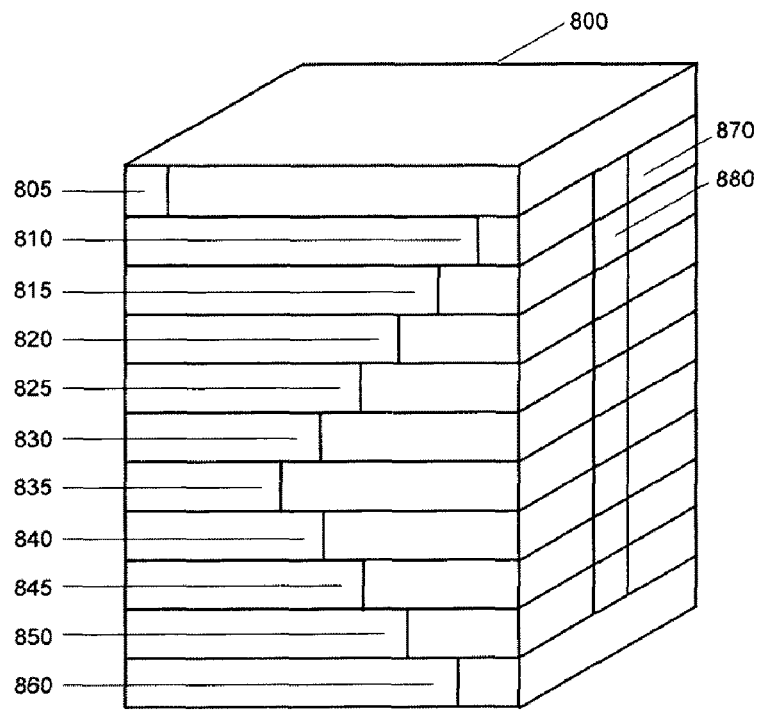
FIG. 8 is a schematic diagram of a three dimensional IC with TSVs connecting multiple layers.

FIG. 8 shows a 3D IC with eleven layers. The TSVs on the façade are single interlayer (805 to 860), while the TSVs on the right façade (870 and 880) are integrated into the entire stack of layers.

Figure 9:
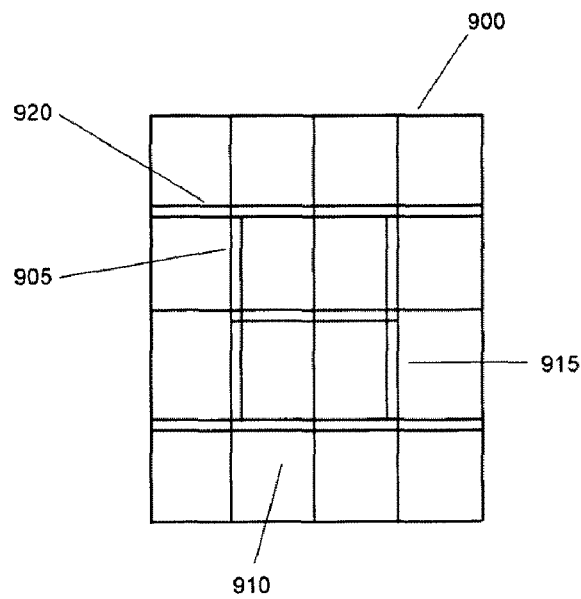
FIG. 9 is a schematic drawing showing the connection of TSVs in a multilayer IC.

FIG. 9 shows the connection of multiple TSVs in a matrix configuration between several layers. The interconnects between layers one and two (920) and between layers three and four (910) provide space between the layers. The TSVs (905 and 915) connect all four layers.

Figure 10:
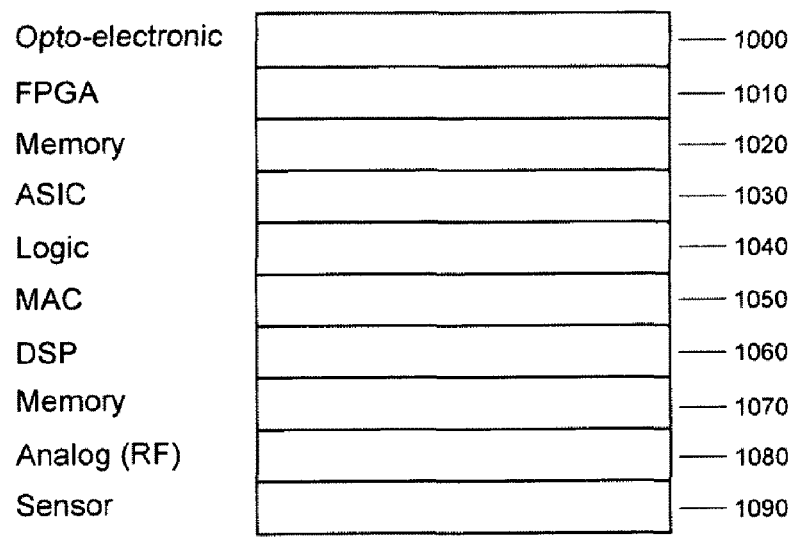
FIG. 10 is a schematic drawing showing multiple logic and memory components in a multilayer hybrid IC.

FIG. 10 shows a multilayer IC with different logic and memory types on different layers. An opto-electronic device is at 1000, an FPGA is at 1010, memory is at 1020 and 1070, and an ASIC is at 1030, a multiprocessor logic device is at 1040, a multiply-accumulate-convert (MAC) logic device is 1050, a digital signal processor (DSP) is at 1060, an analog device (radio frequency) is at 1080 and a sensor is at 1090. This multifunctional representation of a 3D IC is configured for specific applications.

Figure 11:
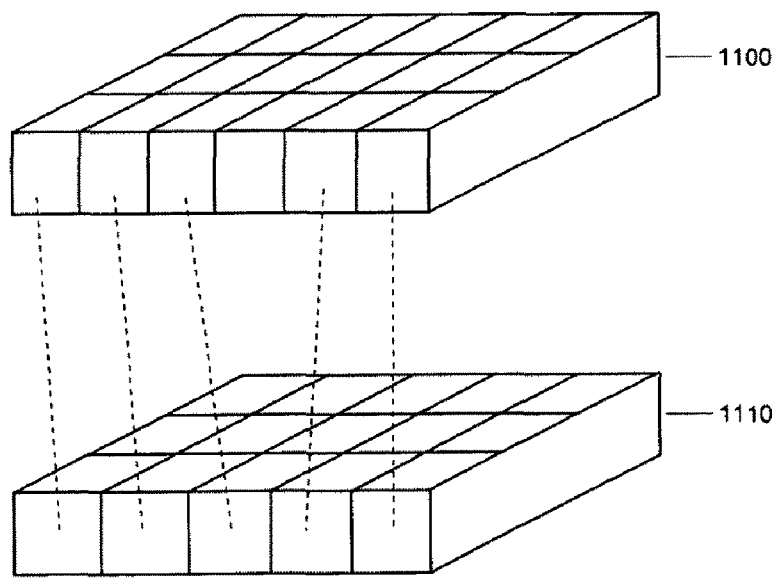
FIG. 11 is a schematic diagram showing multiple tiles on two layers of a multilayer IC and the TSVs connecting the layers.
Figure 12:
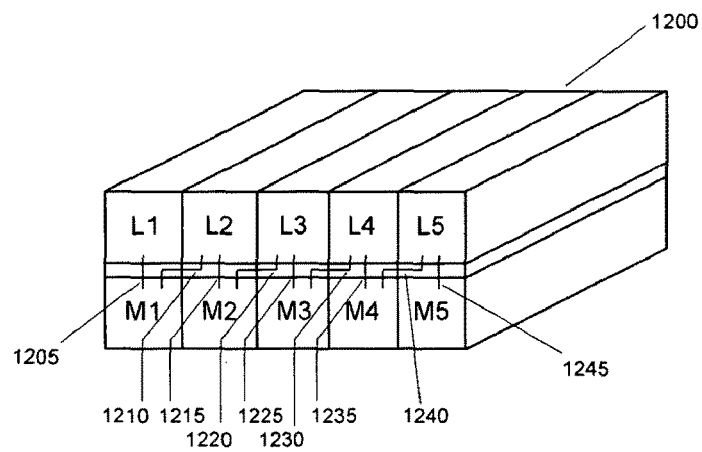
FIG. 12 is a schematic diagram of logic layer tiles connected to memory tiles in a multilayer integrated circuit.

FIG. 11 shows the stacking of two different types of IC layers (1100 and 1110) for connections between tiles of differently configured devices. FIG. 12 shows the stacking of logic and memory devices. The sections of the logic device are connected to sections of the memory device by multiple vias to abutting and adjacent sections. L2 is connected to both M2 (1215) and M1 (1210). L3 is connected to both M3 (1225) and M2 (1220). L4 is connected to both M4 (1235) and M3 (1230). L5 is connected to both M5 (1245) and M4 (1240). L1 is connected to M1 at 1205.

Figure 13:
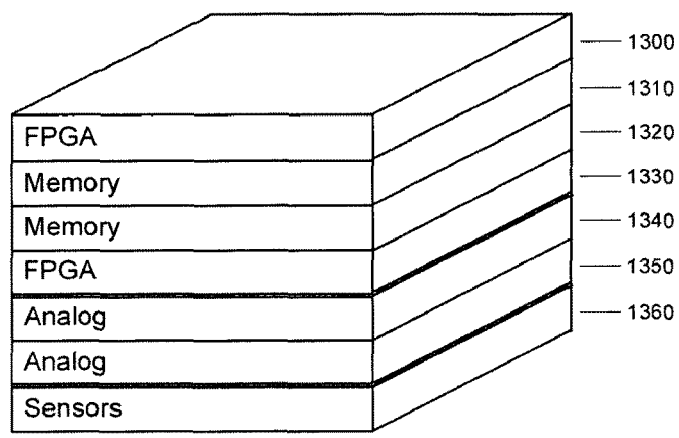
FIG. 13 is a schematic diagram of a multilayer IC with heavy shielding between layers.

FIG. 13 shows the use of two memory layers (1310 and 1320) sandwiched between two FPGA layers (1300 and 1330). The digital logic and memory layers are separated from the analog layers (1340 and 1350) by shielding. The analog layers are also separated from the sensor layer (1360) by shielding.

Figure 14:
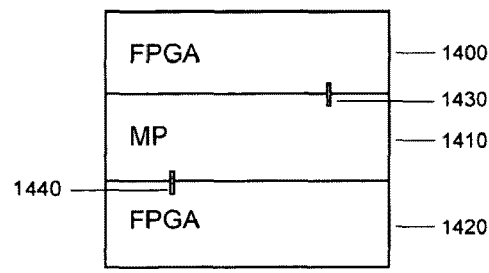
FIG. 14 is a schematic drawing of a multilayer IC with multiple logic types connecting several layers with TSVs.
Figure 15:
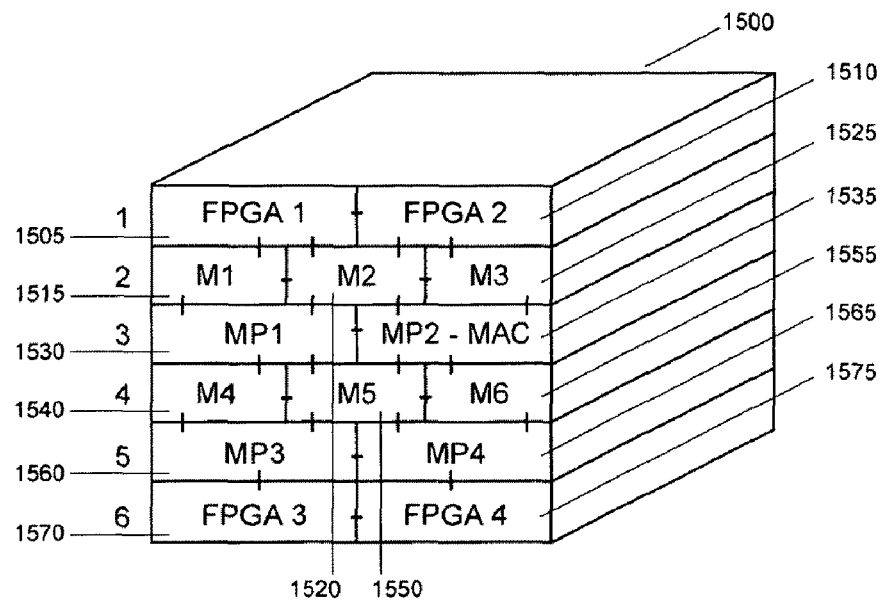
FIG. 15 is a schematic diagram of logic types and memory types on tiles in a multilayer integrated circuit.

FIGS. 14 and 15 show 3D hybrid circuits that consist of both a microprocessor layer and a reconfigurable hardware (FGPA) layer. FIG. 14 shows the use of TSVs (1430 and 1440) between FPGA layers (1400 and 1420) and a microprocessor layer (1410) in a multilayer hybrid IC. FIG. 15 shows a six layer hybrid IC with FPGAs (1505, 1510, 1570 and 1575) on tiles of the first and sixth layers. Memory layers with different memory types are sandwiched between the FPGA and microprocessor layers. M1 (1515), M2 (1520), M3 (1525) are sandwiched between the FPGAs at layer one and the microprocessors on layer three and are connected by TSVs to each adjacent logic tile. The microprocessors (1, 2, 3 and 4 at 1530, 1555, 1570 and 1575) on layers three and five use the memory tiles (M4, M5 and M6 at 1540, 1550 and 1555) on layer five. This configuration maximizes space and computational efficiency and access to data and instructions from the microprocessor layers.

Figure 16:
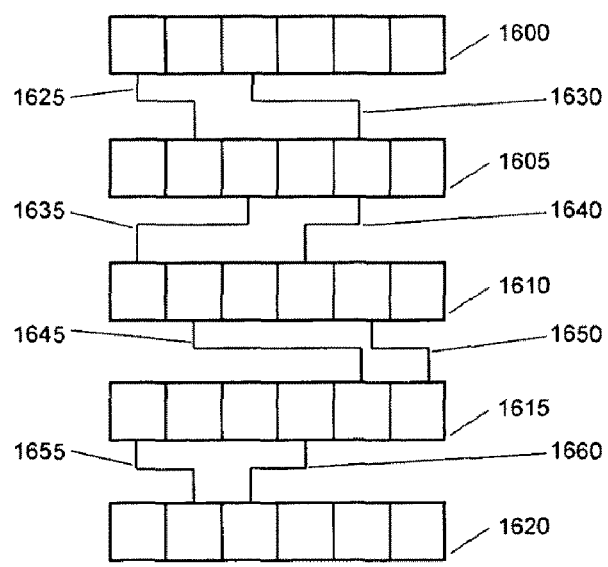
FIG. 16 is a schematic drawing of several layers of a multilayer IC with TSVs connecting tiles.

FIG. 16 shows the use of TSVs to connect tiles of different layers in a multilayer IC.

Figure 17:
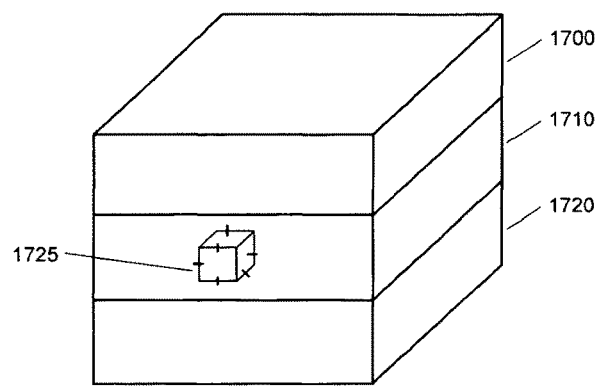
FIG. 17 is a schematic diagram illustrating a three dimensional router in a central layer of a three layer three dimensional IC in which the router operates as a six-way switch.
Figure 18:
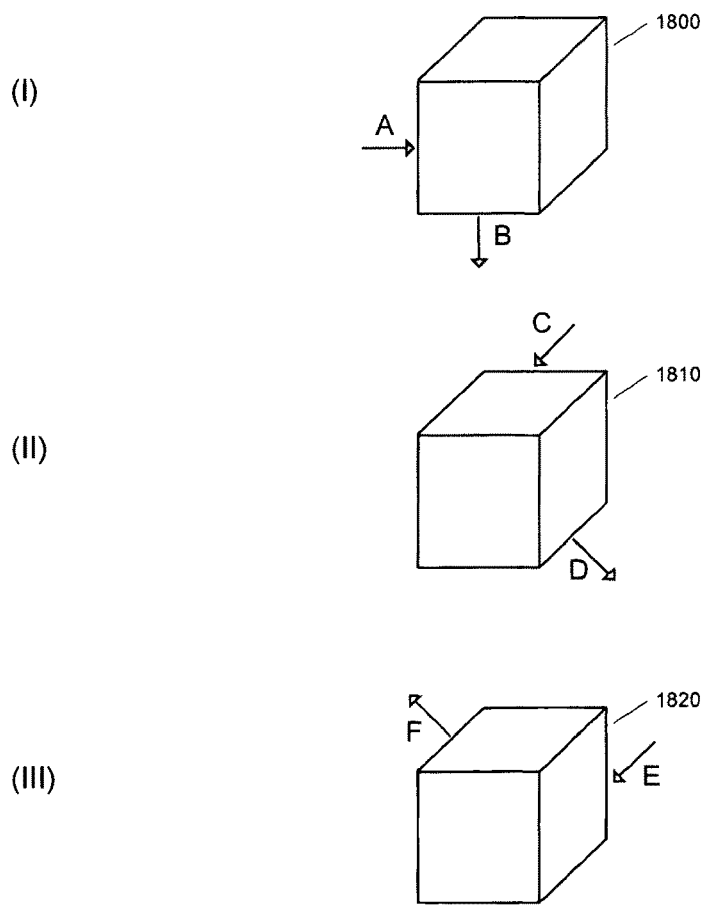
FIG. 18 is a schematic diagram showing the three phases of the reprioritization process of a three dimensional router.

FIG. 17 shows a three dimensional router (1725) in a central layer of a multilayer IC. The router has connections on each façade. FIG. 18 shows several phases of a process of routing data or instructions in the 3D router. In phase one, data enters at A and departs at B. In phase two, data enters at C and exits at D. In phase three, data enters at E and exits at F.

Figure 19:
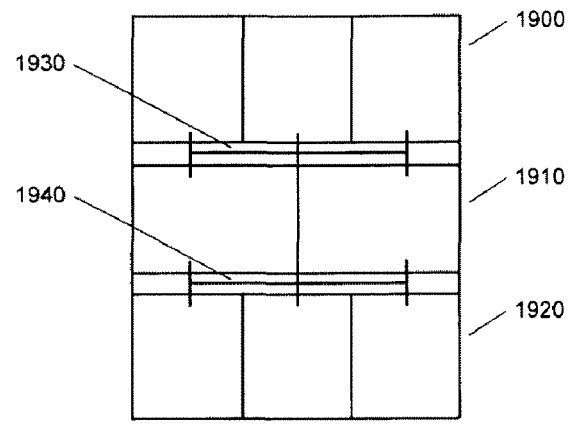
FIG. 19 is a schematic diagram showing channels between layers of a multilayer IC.

FIG. 19 shows the use of channels between layers in a multilayer IC. The channels (1930 and 1940) are connected by a TSV. TSVs are integrated into the borders of the channels in order to connect the tiles of layers one (1900) and three (1920).

Figure 20:
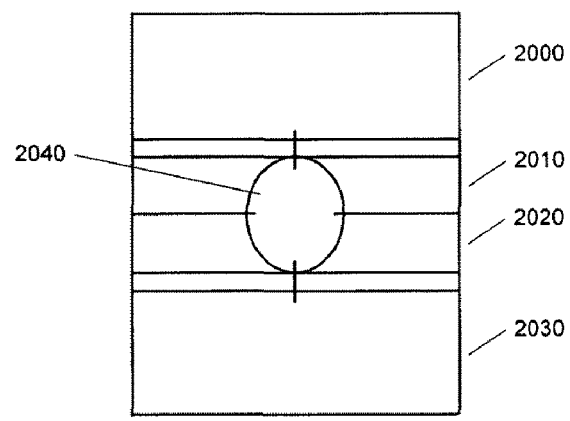
FIG. 20 is a schematic diagram showing a spherical internal element in a multilayer IC.

FIG. 20 shows the use of a spherical internal element (2040) in the center layer of a multilayer IC. Interconnects and TSVs connect the spherical element to layers one (2000) and three (2030).

Figure 21:
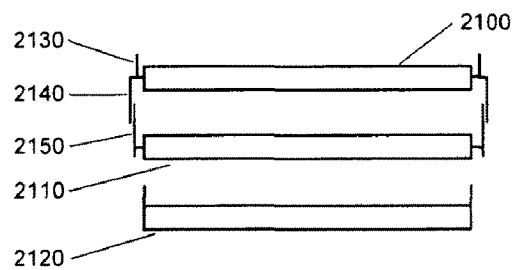
FIG. 21 is a schematic diagram showing stacked IC layers with pins and sockets in a multilayer IC.

FIG. 21 shows the use of pins (2120 and 2150) connecting three layers (2100, 2110 and 2120). The pins operate by slipping into grooves (2140) in an adjacent pin assembly. This apparatus configuration allows the modular connection of layers in a multilayer IC package.

Figure 22:
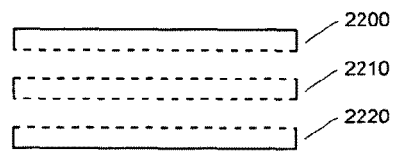
FIG. 22 is a schematic diagram showing holes for vias in a multilayer IC.

FIG. 22 shows the holes for vias in a multilayer IC.

Figure 23:
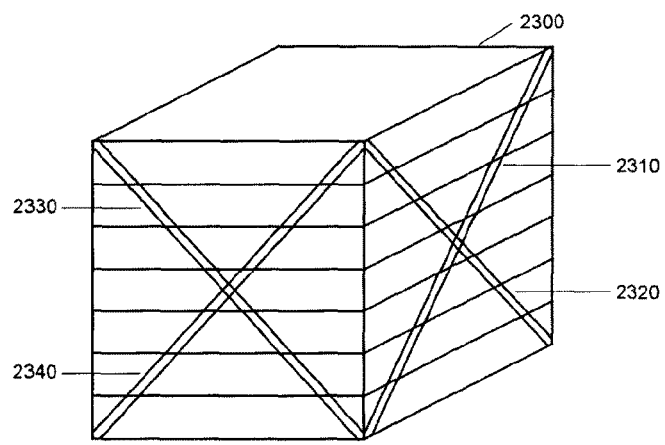
FIG. 23 is a schematic diagram illustrating side crossbars in a multilayer IC package.

FIG. 23 shows the use of crossbars on the periphery of a multilayer IC assembly. The crossbars (2310 and 2320 illustrated on one façade of the 3D IC and 2330 and 2340 on another façade) provide support for connection of the IC packaging. In addition, the crossbars provide the use of supplementary memory.

Figure 24:
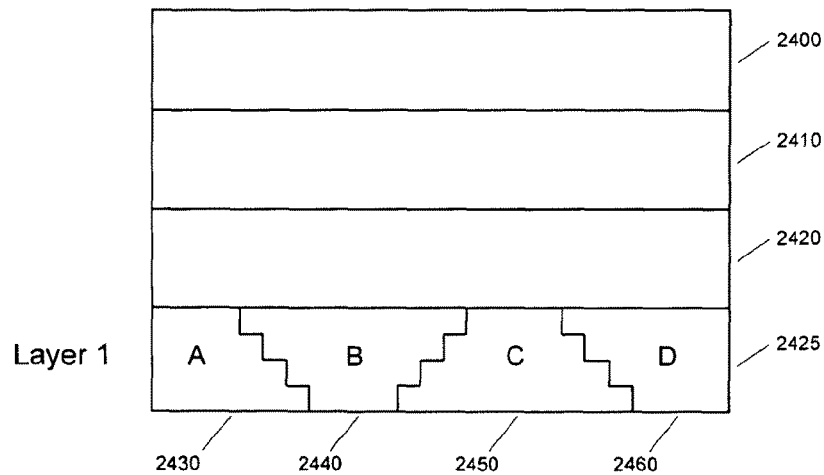
FIG. 24 is a schematic drawing of an inverted pyramid structure for TSVs on a layer of a multilayer IC.
Figure 25:
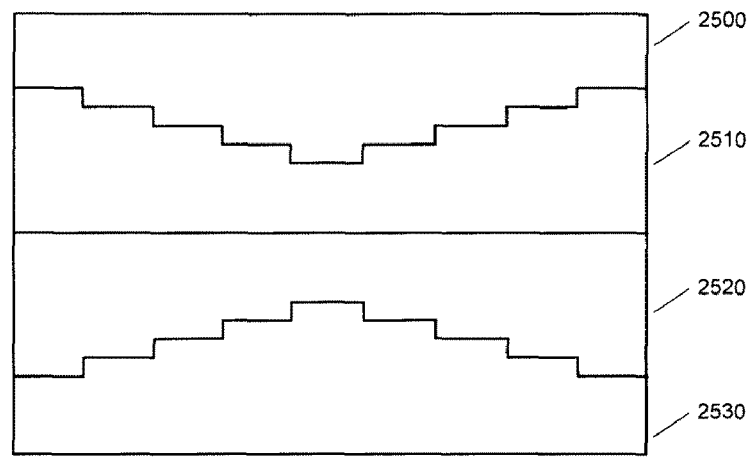
FIG. 25 is a schematic drawing of multiple inverted pyramids in adjoining layers of a multilayer IC.

FIGS. 24 and 25 show the use of inverted pyramid structures in layers of multilayer ICs. The inverted pyramids are useful for integration of TSVs for access to multiple tiles on different layers. In FIG. 24, the inverted pyramid structure separates sections A (2430), B (2440), C (2450) and D (2460) on layer one. In FIG. 25, the inverted pyramid structures are shallow. They are constructed of inverted stacks of ICs and sandwiched together to integrate TSVs and interconnects between layers. The layer at 2500 is sandwiched to the layer at 2510. The layer at 2520 is sandwiched to the layer at 2530.

Figure 26:
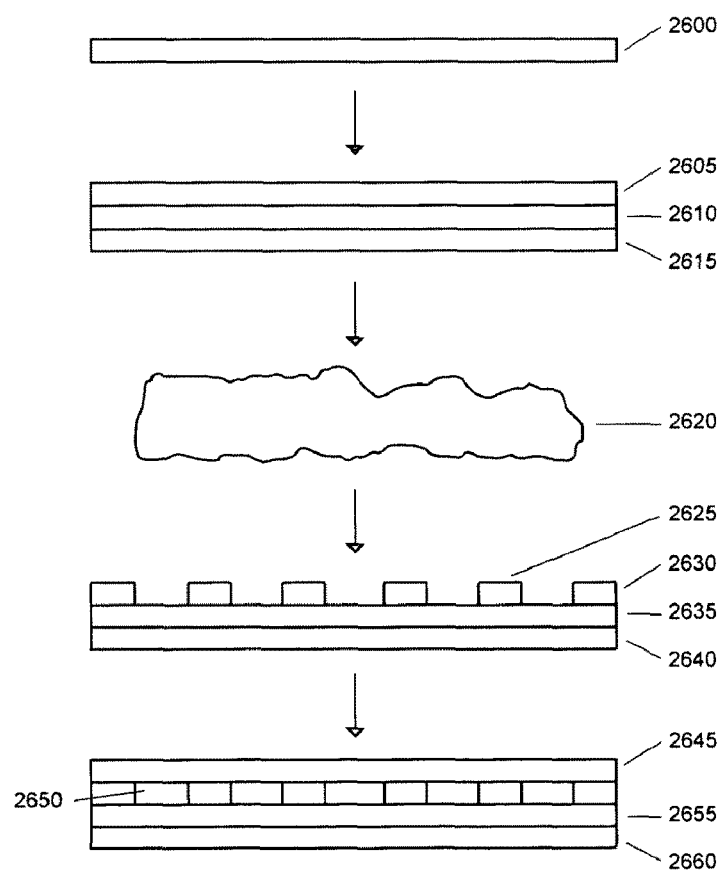
FIG. 26 is a schematic diagram illustrating the five stage fabrication process with bonding, plasma, etching and bonding phases.

FIG. 26 shows a fabrication process for construction of a multilayer IC. In the first phase, a single layer is constructed. Two other layers are sandwiched (2605, 2610 and 2615) to this initial layer. Plasma (2620) is added to remove the gaps in the top layer of the assembly. This top layer (2630) of the assembly contains gaps at the top of the assembly. A layer (2645) is sandwiched to the top of the assembly to create gaps in the second layer. These gaps are filled with metals and used for TSVs or remain blank in order to be used for heat dissipation.

Figure 27:
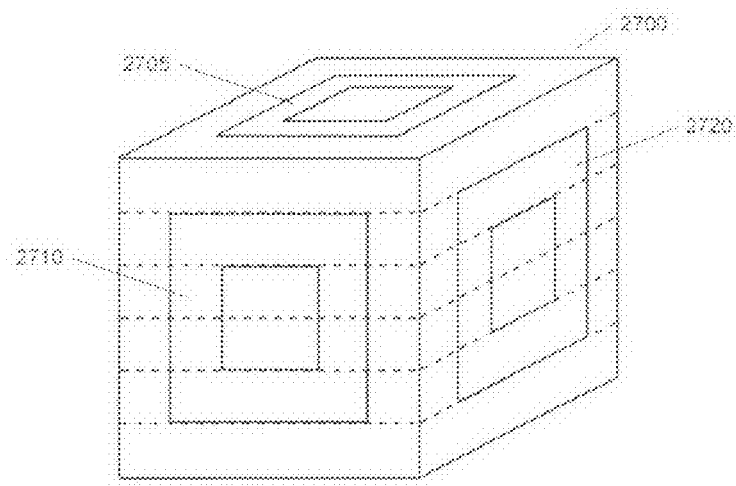
FIG. 27 is a schematic drawing showing pins in packaging on the side of a multilayer IC.

FIG. 27 shows the 3D IC package assembled with pins (seen here in square configurations at 2705, 2710 and 2720) on the sides of the device. The pins are used to connect specific nodes in the device to external applications.

Figure 28:
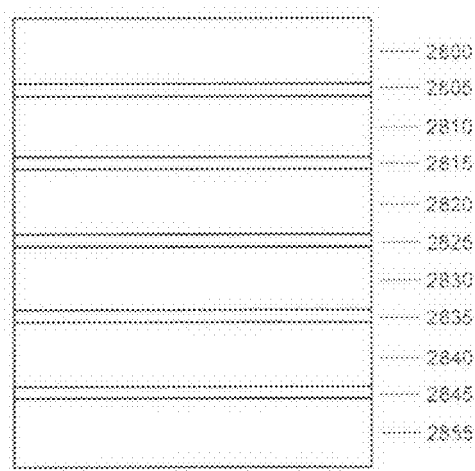
FIG. 28 is a schematic drawing showing empty chambers between layers, used as heat vents, in a multilayer IC.

FIG. 28 shows the use of empty chambers between layers of a multilayer IC. The empty chambers are used as heat vents.

Figure 29:
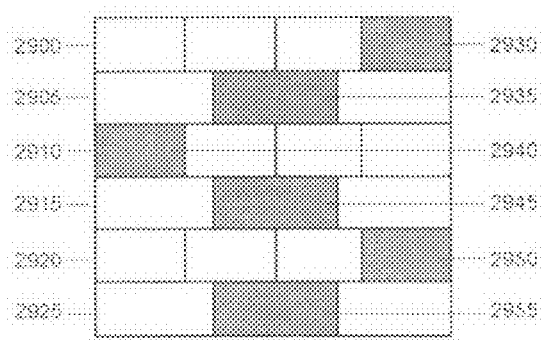
FIG. 29 is a schematic drawing showing a top view of blank tiles, used for heat dissipation, on one layer of a multilayer IC.

FIG. 29 is a top view of a layer in a 3D IC. The blank gaps (2930, 2935, 2940, 2945, 2950 and 2955) on tiles of the IC layer are used for heat dissipation.

Figure 30:
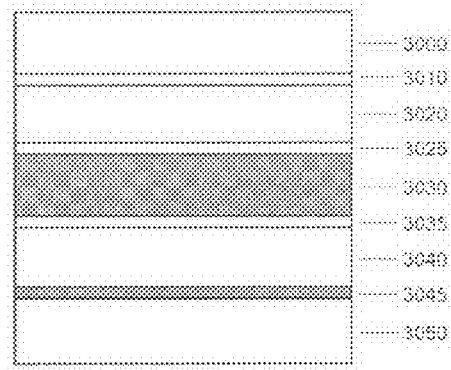
FIG. 30 is a schematic drawing showing an empty layer and empty layer between stacks of multilayer ICs in a 3D IC node.

FIG. 30 is a side view of a multilayer IC showing the use of blank gaps on a layer (3030) and a channel (3045) between layers. The gaps are used to separate layers due to interference.

Figure 31:
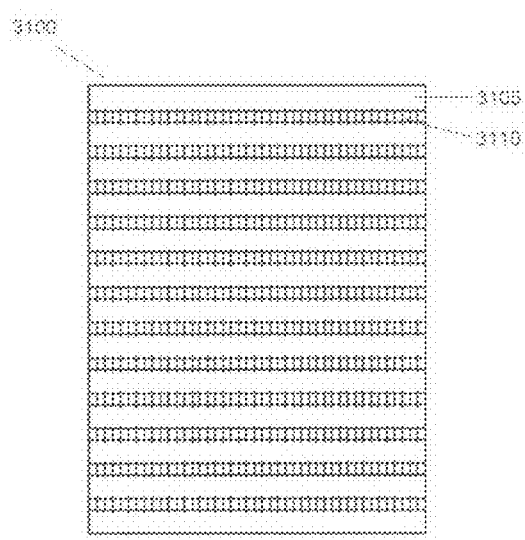
FIG. 31 is a schematic drawing showing the top view of rows of 3D transistors in a semiconductor.

FIG. 31 shows the use of 3D transistors on a layer of a 3D IC. The transistors use a crossbar between elements.

Figure 32:
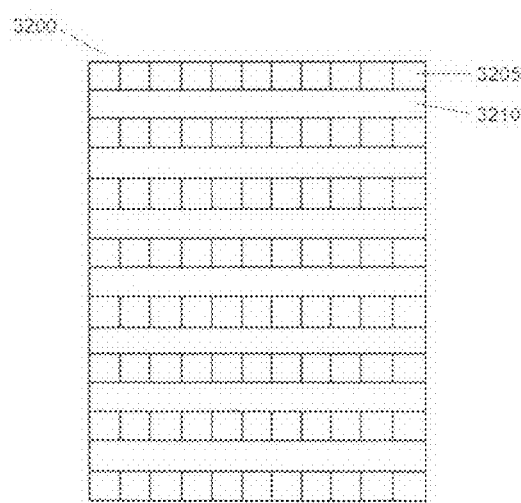
FIG. 32 is a schematic drawing showing the top view of nano-wires with cross bar latches on a layer of a multilayer IC.

FIG. 32 shows the top view of nano-wires with cross bar latches on a layer of a multilayer IC. This approach is used as an alternative model to traditional transistors on layers of 3D ICs.

Figure 33:
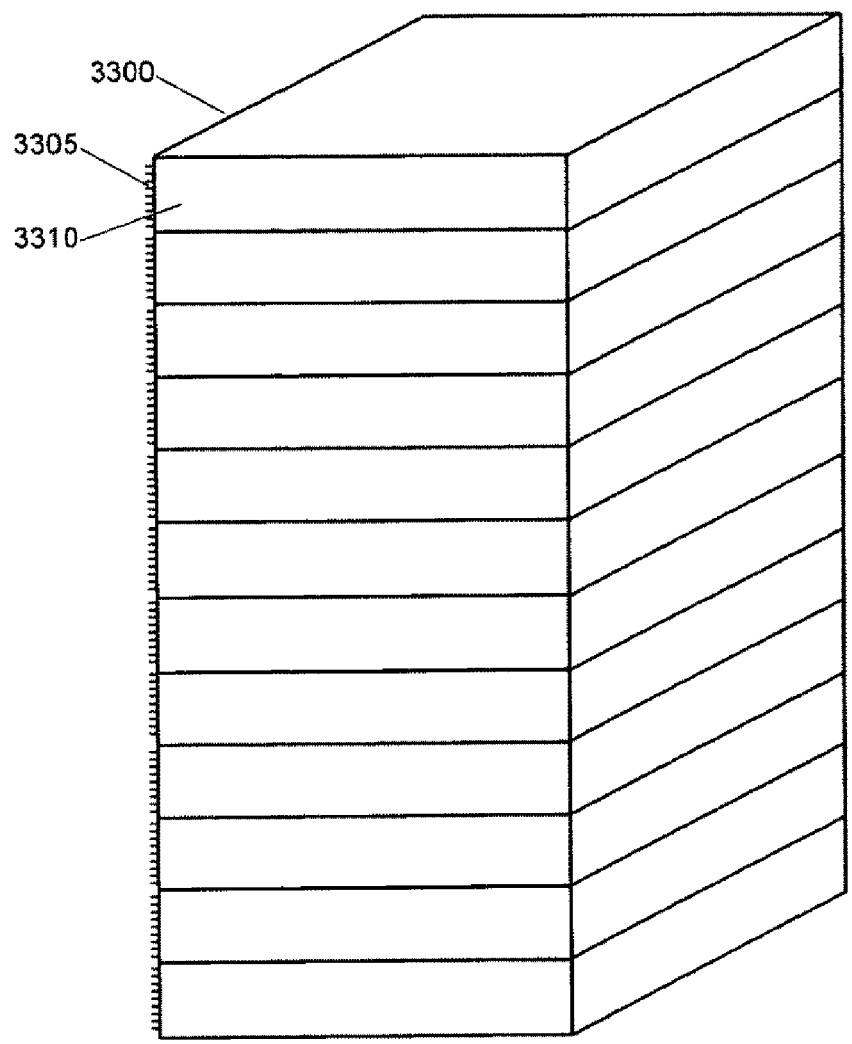
FIG. 33 is a schematic drawing illustrating the stacking of 3D multilayer ICs into an integrated 3D IC node.

FIG. 33 shows the stacking of twelve layers of IC clusters in a 3D IC. Each cluster consists of several layers of ICs.

I claim:

1. A three dimensional (3D) integrated circuit (IC) which is formed by organizing semiconductor integrated circuits into a multi-layer IC with through silicon vias (TSVs), comprising:

logic or memory circuits configured on circuit layers;

TSVs, connecting adjacent circuit layers;

wherein two or more circuit layers of ICs are connected with contiguous TSVs;

wherein electronic signals are transmitted through the TSVs from an IC on one layer of the multi-layer IC to other circuit layers;

wherein each circuit layer of the multi-layer IC contains individual tiles on which are structured logic or memory circuits;

wherein when at least two tiles on a same circuit layer of the multi-layer IC are connected, the tiles are connected by interconnects; and wherein the multi-layer IC performs specific computational tasks.

2. The three dimensional integrated circuit of claim 1:

wherein the tiles are configured in irregular patterns;

wherein the irregular patterns of tiles consist of different size tiles; and wherein the TSVs are configured to connect circuit components on tiles between two or more circuit layers.

3. The three dimensional integrated circuit of claim 1:

wherein at least one logic circuit type on a circuit layer in the multi-layer IC consists of a microprocessor.

4. The three dimensional integrated circuit of claim 1:

wherein at least one logic circuit type on a circuit layer in the multi-layer IC consists of a complex programmable logic device.

5. The three dimensional integrated circuit of claim 1:

wherein at least one logic circuit type on a circuit layer in the multi-layer IC consists of an application specific integrated circuit.

6. The three dimensional integrated circuit of claim 1:

wherein the TSVs in the multi-layer IC are integrated using an inverted pyramid configuration that connects circuit layers of the three dimensional integrated circuit.

7. A three dimensional (3D) integrated circuit (IC) which is formed by organizing semiconductor integrated circuits into a set of layers of circuits with through silicon vias (TSVs), comprising:

a multi-layer integrated circuit comprising at least two circuit layers of integrated circuits in a multi-layer system on a chip (SoC) module;

interconnects and TSVs to connect circuit components;

wherein the multi-layer IC is a hybrid circuit fabric consisting of a set of logic circuit types including at least, two of microprocessor or FPGA logic circuit components and at least one memory circuit component on at least two circuit layers;

wherein the multi-layer integrated circuit contains at least one of FPGA, microprocessor or memory circuit components on tiles on specific circuit layers; and wherein the at least one logic circuit components and memory circuit component are connected by interconnects and TSVs.

8. The three dimensional integrated circuit of claim 7:

wherein the tiles are configured in irregular patterns;

wherein the irregular patterns of tiles consist of different size tiles; and wherein the TSVs are configured to connect the circuit components on tiles between two or more circuit livers.

9. A multi-planar integrated circuit (IC) system consisting of a plurality of circuit planes in a three dimensional (3D) system on a chip (SoC) connected with through silicon vias (TSVs) comprised of:

a plurality of circuit layers, each layer of which includes at least one of logic and memory circuit components;

TSVs connecting circuits on adjacent circuit layers;

an interface configured to provide access to the memory and logic circuit components;

wherein logic and memory circuits on two or more layers of the plurality of circuit layers are connected with contiguous TSVs;

wherein the multi-planar IC is a heterogeneous fabric consisting of at least two of microprocessor, FPGA, ASIC and memory circuit components on tiles on specific circuit layers;

wherein interconnection between the circuit components on tiles of a same circuit layer of the multi-planar integrated circuit are connected by interconnects;

wherein the at least one memory circuits are used by at least one microprocessor, FPGA or ASIC circuit components; and wherein the memory circuits store data and instructions.

10. The multi-planar integrated circuit system of claim 9:

wherein the tiles are configured in irregular patterns;

wherein the irregular patterns of tiles consist of different size tiles; and wherein the TSVs are configured to connect the circuit components on tiles between two or more circuit layers.

11. The multi-planar integrated circuit system of claim 9:

wherein the memory circuits are accessed by logic circuit components on circuit layers within the 3D SoC.

12. The multi-planar integrated circuit system of claim 9:

wherein when the system uses the at least one logic circuit Component on one circuit layer to store and access data or instructions in at least one memory circuit on at least one circuit layer of the 3D SoC, a sequence of processing data or instructions changes in different logic applications.

13. The multi-planar integrated circuit system of claim 9:

wherein data and instructions are transmitted through the TSVs from the circuits on one layer of the 3D SoC to circuits on other layers.

14. The multi-planar integrated circuit system of claim 9:

wherein data or instructions are transferred between logic circuit components on at least one circuit layer.

15. The multi-planar integrated circuit system of claim 9:

wherein when an FPGA reconfigures its logic circuit configuration, at least one other logic circuit in the 3D SoC continues to process data and instructions.

16. The multi-planar integrated circuit system of claim 9:

wherein at least two memory circuits on at least two circuit layers are accessed by at least one logic circuit component of the 3D SoC.

17. The multi-planar integrated circuit of claim 9:

wherein the configuration of the 3D SoC is application specific.

18. The multi-planar integrated circuit system of claim 9:

wherein data or instructions from at least one logic circuit component in the 3D SoC are accessed simultaneously by at least two logic circuit components on at least one circuit layer.

19. The multi-planar integrated circuit system of claim 9:

wherein the data or instructions in a logic circuit component of a circuit layer are processed by at least one logic circuit component on at least one other circuit layer.

20. The multi-planar integrated circuit system of claim 9:

wherein a memory circuit of at least one circuit layer is accessed by a logic circuit component of at least one other circuit layer.

\* \* \* \* \*